United States Patent
Ma et al.

(10) Patent No.: US 8,373,462 B2
(45) Date of Patent: Feb. 12, 2013

(54) DELAY LOCK LOOP AND DELAY LOCK METHOD

(75) Inventors: Yantao Ma, Boise, ID (US); Aaron Willey, Boise, ID (US)

(73) Assignee: Nanya Technology Corp., Kueishan, Tao-Yuan Hsien (TW)

( * ) Notice: Subject to any disclaimer, the term of this patent is extended or adjusted under 35 U.S.C. 154(b) by 77 days.

(21) Appl. No.: 13/110,928

(22) Filed: May 19, 2011

(65) Prior Publication Data
US 2012/0293221 A1 Nov. 22, 2012

(51) Int. Cl.
*H03L 7/06* (2006.01)
(52) U.S. Cl. ............................. 327/156; 327/147
(58) Field of Classification Search ............... 327/147, 327/156
See application file for complete search history.

(56) References Cited

U.S. PATENT DOCUMENTS

| | | | | |
|---|---|---|---|---|
| 5,790,942 A * | 8/1998 | Le Corre et al. | ............... | 455/112 |
| 6,556,643 B2 * | 4/2003 | Merritt | ............... | 377/16 |
| 7,622,996 B2 * | 11/2009 | Liu | ............... | 331/11 |
| 7,671,647 B2 * | 3/2010 | Gomm et al. | ............... | 327/158 |
| 7,898,308 B2 * | 3/2011 | Gomm et al. | ............... | 327/158 |
| 2001/0048329 A1 * | 12/2001 | Sumi | ............... | 327/156 |
| 2003/0001637 A1 * | 1/2003 | Jung | ............... | 327/158 |
| 2003/0030473 A1 * | 2/2003 | Lee | ............... | 327/158 |
| 2003/0038662 A1 * | 2/2003 | Merritt | ............... | 327/158 |
| 2008/0061888 A1 * | 3/2008 | Liu | ............... | 331/11 |
| 2010/0213992 A1 * | 8/2010 | Hyun et al. | ............... | 327/147 |
| 2012/0120745 A1 * | 5/2012 | Miyano et al. | ............... | 365/193 |

* cited by examiner

*Primary Examiner* — Adam Houston
(74) *Attorney, Agent, or Firm* — Winston Hsu; Scott Margo

(57) ABSTRACT

A delay lock loop comprising: a first delay loop, for delaying an input signal to generate a first output signal; a second delay loop, for frequency-dividing and delaying the input signal to generate a second output signal, wherein a frequency of the first output signal is higher than which of the second output signal; a phase detector, selectively detecting phases of the input signal, and one of the first delayed output signal and the second delayed output signal, to generate a phase detecting result; and a delay control circuit, for generating a first and a second delay control signal according to the phase detecting result, wherein the first and the second delay control signals are respectively transmitted to the first delay loop and the second delay loop, to control delay amounts of the first delay loop and the second delay loop.

16 Claims, 4 Drawing Sheets

DELAY LOCK LOOP AND DELAY LOCK METHOD

BACKGROUND OF THE INVENTION

1. Field of the Invention

The present invention relates to a delay lock loop and delay lock method, and particularly relates to a delay lock loop, delay lock method, and delay lock updating method utilizing normal and/or reduced frequency in one or more delay loops.

2. Description of the Prior Art

FIG. 1 is a prior art delay lock loop 100. As shown in FIG. 1, the delay lock loop 100 includes a controllable delay line 103, a phase detector 105, and a delay control circuit 107. The controllable delay line 103 delays the input signal IS to generate an output signal OS according to a control signal CS from the delay control circuit 107. The phase detector 105 detects the phases of the input signal IS (a clock signal in this example) and the output signal OS to determine the phase relations there between (i.e which phase leads the other phase), thereby generates a phase detecting result. The phase detecting result is transmitted to the delay control circuit 107, which controls delay amount of the controllable delay line 103 according to the phase detecting result. By this way, a output signal OS having desired phase information can be acquired.

Besides above devices, the delay lock loop 100 can further comprise a plurality of buffers for signal synchronization, for example, buffers 101, 109, 111 and 113. In this example, the buffer 101 serves to buffer the input signal IS, the buffer 113 serves to buffer the output signal OS, the buffer 109 is a replica clock buffer, and the buffer 111 is a replica output signal buffer.

However, if the delay lock loop 100 operates at a high frequency, the power consumption is high, but has larger forward path delay if the delay lock loop 100 operates at a low frequency. This is a trade off for the delay lock loop 100.

SUMMARY OF THE INVENTION

Accordingly, one objective of the present invention is to provide a delay lock loop having delay loops operating at different frequencies and saving power by maintaining DLL lock conditions using reduced frequency whenever is possible.

One embodiment of the present invention discloses a delay lock loop, which comprises: a first delay loop, for delaying an input signal to generate a first output signal; a second delay loop, for frequency-dividing and delaying the input signal to generate a second output signal, wherein a frequency of the first output signal is higher than which of the second output signal; a phase detector, for receiving the input signal, a first delayed output signal and a second delayed output signal, to selectively detect phases of the input signal, and one of the first delayed output signal and the second delayed output signal, to generate a phase detecting result, wherein the first delayed output signal and the second delayed output signal are respectively generated according to the first output signal and the second output signal; and a delay control circuit, for generating a first delay control signal and a second delay control signal according to the phase detecting result, wherein the first and the second delay control signal are respectively transmitted to the first delay loop and the second delay loop, to control delay amounts of the first delay loop and the second delay loop.

Another embodiment of the present invention discloses a delay lock method, applied to a delay lock loop including a first delay loop and a second delay loop. The delay lock method comprises: utilizing the first delay loop to delay an input signal to generate a first output signal; utilizing the second delay loop to frequency-divide and to delay the input signal to generate a second output signal, wherein a frequency of the first output signal is higher than which of the second output signal; selectively detecting phases of the input signal, and one of the first delayed output signal and the second delayed output signal, to generate a phase detecting result, wherein the first delayed output signal and the second delayed output signal are respectively generated according to the first output signal and the second output signal; and generating a first and a second delay control signal according to the phase detecting result, wherein the first and the second delay control signal are respectively transmitted to the first delay loop and the second delay loop, to control delay amounts of the first delay loop and the second delay loop.

In view of above-mentioned embodiments, two delay loops operating at different frequencies are applied to a single delay lock loop. The delay loop operating at higher frequency can be utilized for initialization, such that forward path delay can be minimized. Besides, power consumption can be decreased since the delay loop operating at lower frequency is utilized after initialization.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, electronic equipment manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 2:
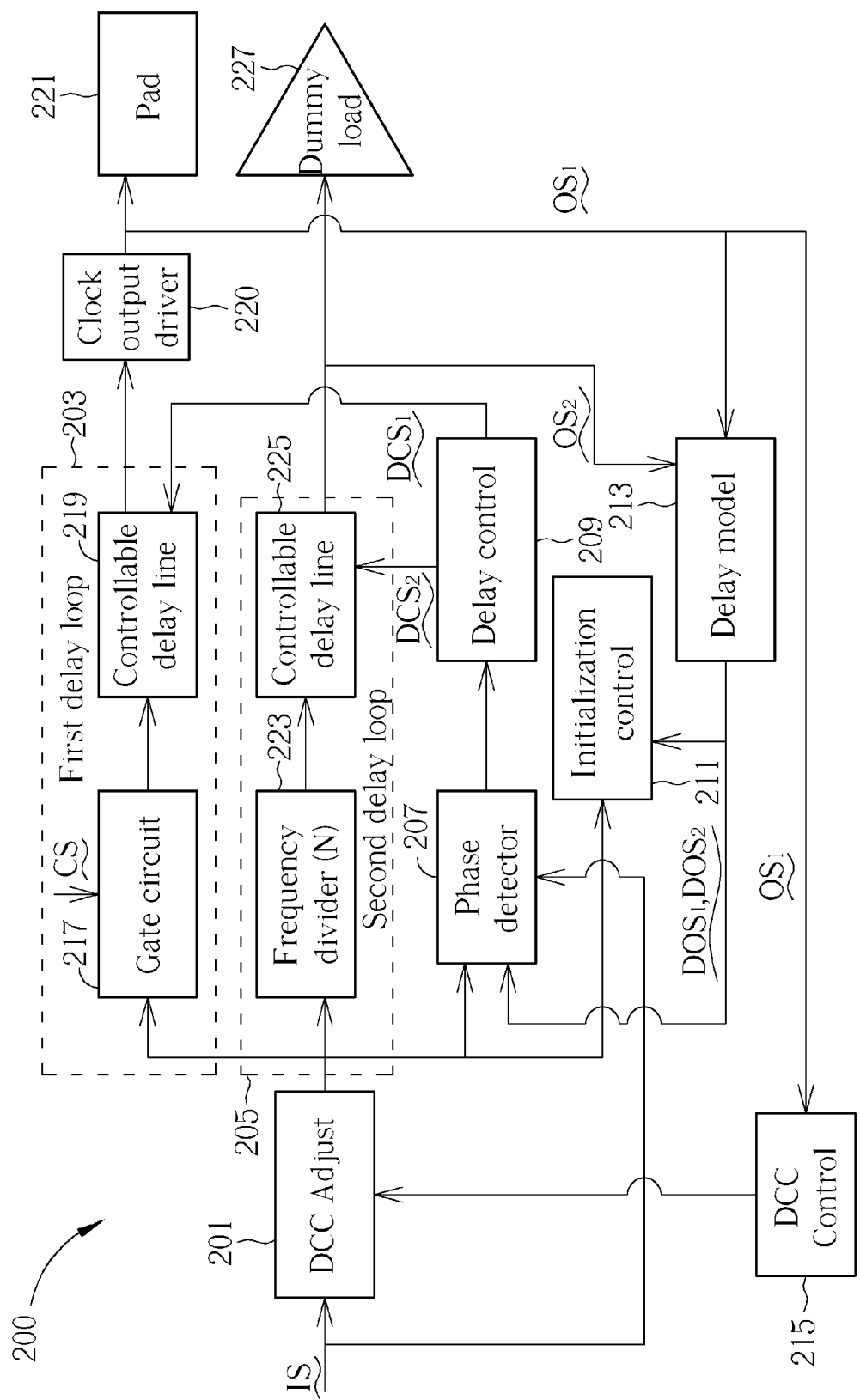
FIG. 2 is a circuit diagram illustrating a delay lock loop according to a first embodiment of the present application.

FIG. 2 is a circuit diagram illustrating a delay lock loop 200 according to a first embodiment of the present application. As shown in FIG. 2, the delay lock loop 200 includes a first delay loop 203, a second delay loop 205, a phase detector 207, and a delay control circuit 209. The first delay loop 203, which is coupled to a pad 221, delays an input signal IS after duty cycle adjusting performed by the duty cycle adjusting circuit 201 to generate a first output signal $OS_1$. The second delay loop 205, which is coupled to a dummy load 227, frequency-divides and delays the input signal IS after duty cycle adjusting to generate a second output signal $OS_2$. The phase detector 207 receives the input signal IS, a first delayed output signal $DOS_1$ and a second delayed output signal $DOS_2$, to selectively detect phases of the input signal IS, and one of the first delayed output signal $DOS_1$ and the second delayed output signal $DOS_2$, to generate a phase detecting result. The first delayed output signal $DOS_1$ and the second delayed output signal $DOS_2$ are respectively generated via delaying the first output signal $OS_1$ and the second output signal $OS_2$, utilizing the delay module 213. The delay control circuit 209 generates a delay control signal $DCS_1$ and $DCS_2$ according to the phase detecting result. The delay control signal $DCS_1$ and $DCS_2$ are transmitted to the first delay loop 203 and the second delay loop 205, to control delay amounts of the first delay loop 201 and the second delay loop 203. In this embodiment, the delay control signal $DCS_1$ and $DCS_2$ are respectively transmitted to the controllable delay lines 219 and 225. $DCS_1$ and $DCS_2$ could be exactly same signal. This is to achieve simultaneous locking for both first delay loop 203 (full speed) and the second delay loop 205 (reduced frequency) for control logic simplification and power saving. Alternatively, $DCS_1$ and $DCS_2$ can have some build-in options for tAC/tDQSCK adjustable delays. The meaning of tAC/tDQSCK adjustable delays can be referred to the DRAM datasheet specifications: the timing difference from output DQ rising edge to the nearest external clock rising edge. That is, output to external clock edge timing adjustable delay. It is for yield enhancement accounting for the possible mismatches in mass production. The delay lock loop 200 can further include a clock output driver 220 located before the pad 221, for driving the clock signal transmitted to the pad 221. The delay amount pf the clock output driver 220 should be equal to which of the delay model 213.

The duty cycle adjusting circuit 201 is controlled by the duty cycle control circuit 215, which receives the first output signal $OS_1$ in this embodiment. Accordingly, the duty cycle control circuit 215 controls the duty cycle adjusting circuit 201 to adjust the duty cycle of the input signal IS according to the first output signal $OS_1$. By this way, real time duty cycle correction at full speed is acquired, since the first output signal OS1 is utilized for duty cycle control. In this embodiment, the input signal IS before duty cycle adjusting is also transmitted to the phase detector 207 for synchronization.

The first delay loop 203 includes a gate circuit 217 and a controllable delay line 219. The gate circuit 217 can be controlled by a control signal CS to turn on or turn off. The control signal CS can be generated from a control circuit (such as the initialization circuit 211, but not limited). The input signal IS after duty cycle adjusting enters the controllable delay line 219.

By this way, the first delay loop 203 operates at full frequency of the input signal IS. Also, the second delay loop 205 includes a frequency divider 223 with a frequency dividing ratio N and a controllable delay line 225, where N can be a predefined value or dynamic generated by control logic for controlling the delay lock loop 200. The signal generated via frequency dividing the input signal IS after duty cycle adjusting enters the controllable delay line 225. By this way, the second delay loop operates at a lower frequency since the controllable delay line 225 receives a signal generated via frequency dividing the input signal IS by a frequency dividing ratio N.

In one embodiment, the first delay loop 203 is turned on while initializing the delay lock loop 200. Additionally, the first delay loop 203 may be turned off while the second delay loop 205 is turned on after initializing the delay lock loop 200. The delay lock loop 200 can further include an initialization control circuit 211 that controls the initialization of the delay lock loop 200. Thus, the first delayed output signal $DOS_1$, the second delayed output signal $DOS_2$ and the input signal IS after duty cycle adjusting are transmitted to the initialization control circuit 211 for initialization control. The initialization control circuit 211 can be incorporated into the delay control circuit 209.

The signal initialization and synchronization is described as follows. Assume the first delay loop locks at delay line $t_A$ and the second delay loop locks at delay line $t_B$, then $$t_{IB}+t_A+t_{OA}=N_1 \cdot t_{ck} \qquad \text{eq(1)}$$

while using the first lock loop to measure initialization. tOA indicates real output delay.

Also, eq(2) can be acquired if a phase detection closed loop uses full frequency reference signal as the PD master clock.

$$t_{IB}+t_B+t_{OB}=N_2 \cdot t_{ck} \qquad \text{eq(2)}$$

tIB=Delay in the clock path before the delay loops 203, 205. $t_{OB}$=Delay in the clock path after the delay loops 203, 205. $t_B$=Delay in the forward clock path within the delay loop. The delay model=$t_{IB}+t_{OB}$; $N_1$ is an integer number of clocks from input to output in the first delay loop 203; similarly, $N_2$ is an integer number of clocks from input to output in the second delay loop 205.

If the same amount of shifts are designed for both the first delay loop and the second delay loop, then $t_A \approx t_B \rightarrow N_1=N_2$ Thus, both paths can be simultaneously synchronized.

The forward path delay can be minimized since the first delay loop 203 operating at a full frequency of the input signal IS is utilized during initialization. The forward path indicates a path from the input signal, through the path then to the pad 221 or the dummy load 227. Besides, after initialization, the power consumption of the whole delay lock loop 200 can be decreased by shutting off first delay line 203 as conditions allow since the second delay loop 205 operating at a lower frequency is utilized after the delay lock loop 200 is initialized.

Figure 3:
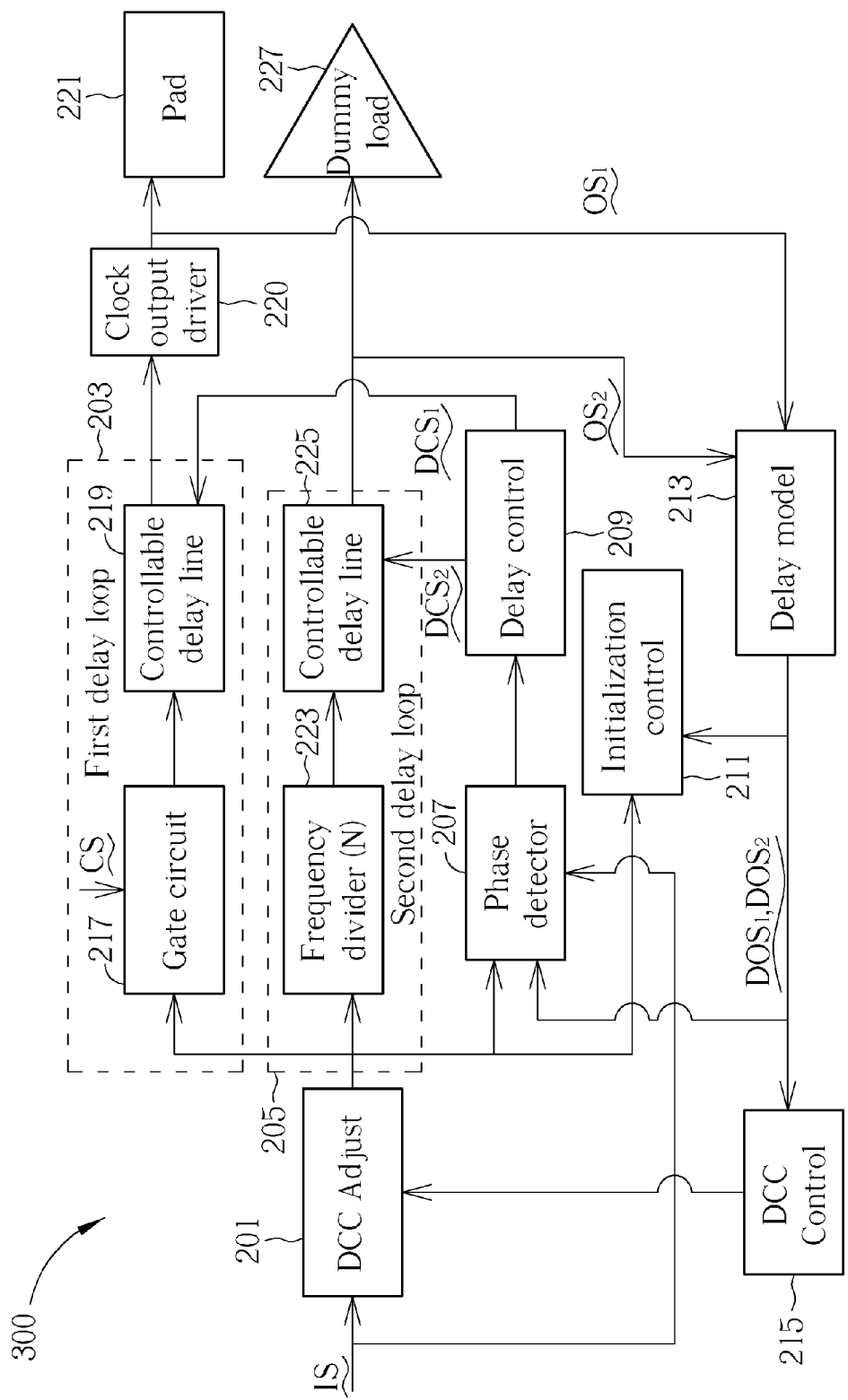
FIG. 3 is a circuit diagram illustrating a delay lock loop according to a second embodiment of the present application.

FIG. 3 is a circuit diagram illustrating a delay lock loop according to a second embodiment of the present application. Comparing with the embodiment shown in FIG. 2 and FIG. 3, one difference is the signal transmitted to the duty cycle control circuit 215. In the embodiment shown in FIG. 2, the duty cycle control circuit 215 receives the first output signal $OS_1$. In the embodiment shown in FIG. 3, the duty cycle control circuit 215 receives the first delayed output signal $DOS_1$ and the second delayed output signal $DOS_2$. In this structure, the duty cycle control circuit 215 can utilize the second delayed output signal $DOS_2$ to adjust the duty cycle for further power saving, such that the duty cycle error is 1/N comparing with utilizing the first delayed output signal $DOS_1$, where N=(frequency of loop 203)/(frequency of loop 205).

Figure 1:
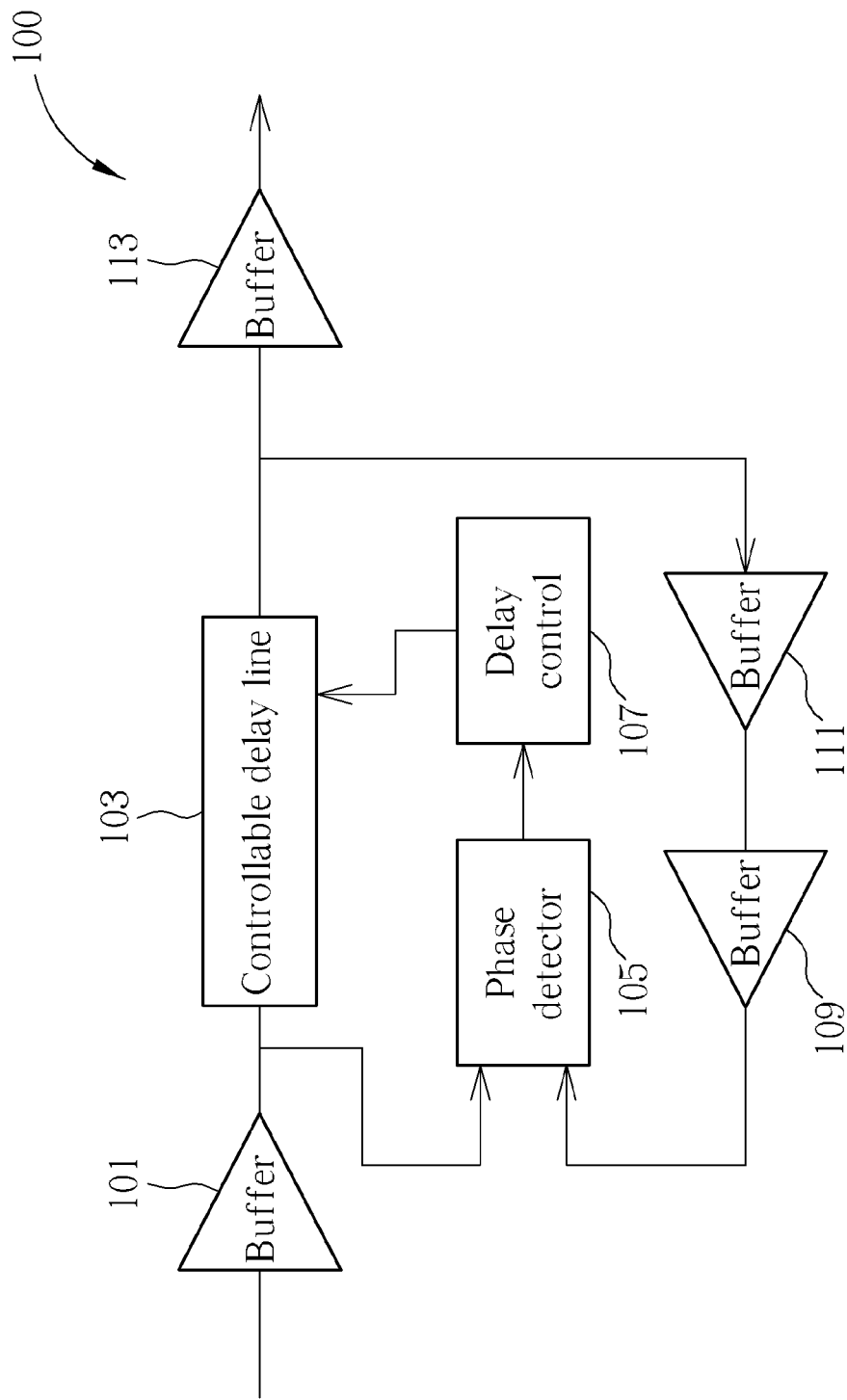
FIG. 1 is a circuit diagram illustrating a prior art delay lock loop.

Please note that the abovementioned embodiments are only for example and do not mean to limit the scope of the present application. For example, the gate circuit 217 in the first delay loop 203 can be replaced with a frequency divider with a frequency dividing ratio smaller than N. In this case, the first output signal $OS_1$ still has a higher frequency than which of the second output signal $OS_2$. Also, the buffers shown in FIG. 1 can also be provided in the above-mentioned embodiments for synchronization. Additionally, the delay model 213, the duty cycle adjusting circuit 201 and the duty cycle adjusting circuit 215 can be omitted if the examiner believes timing of the signal can be well controlled without these devices or due to other reasons. Similar with the embodiment shown in FIG. 2, the delay lock loop 300 in FIG.

3 can further include a clock output driver 220 located before the pad 221, for driving the clock signal transmitted to the pad 221. The delay amount pf the clock output driver 220 should be equal to which of the delay model 213.

Figure 4:
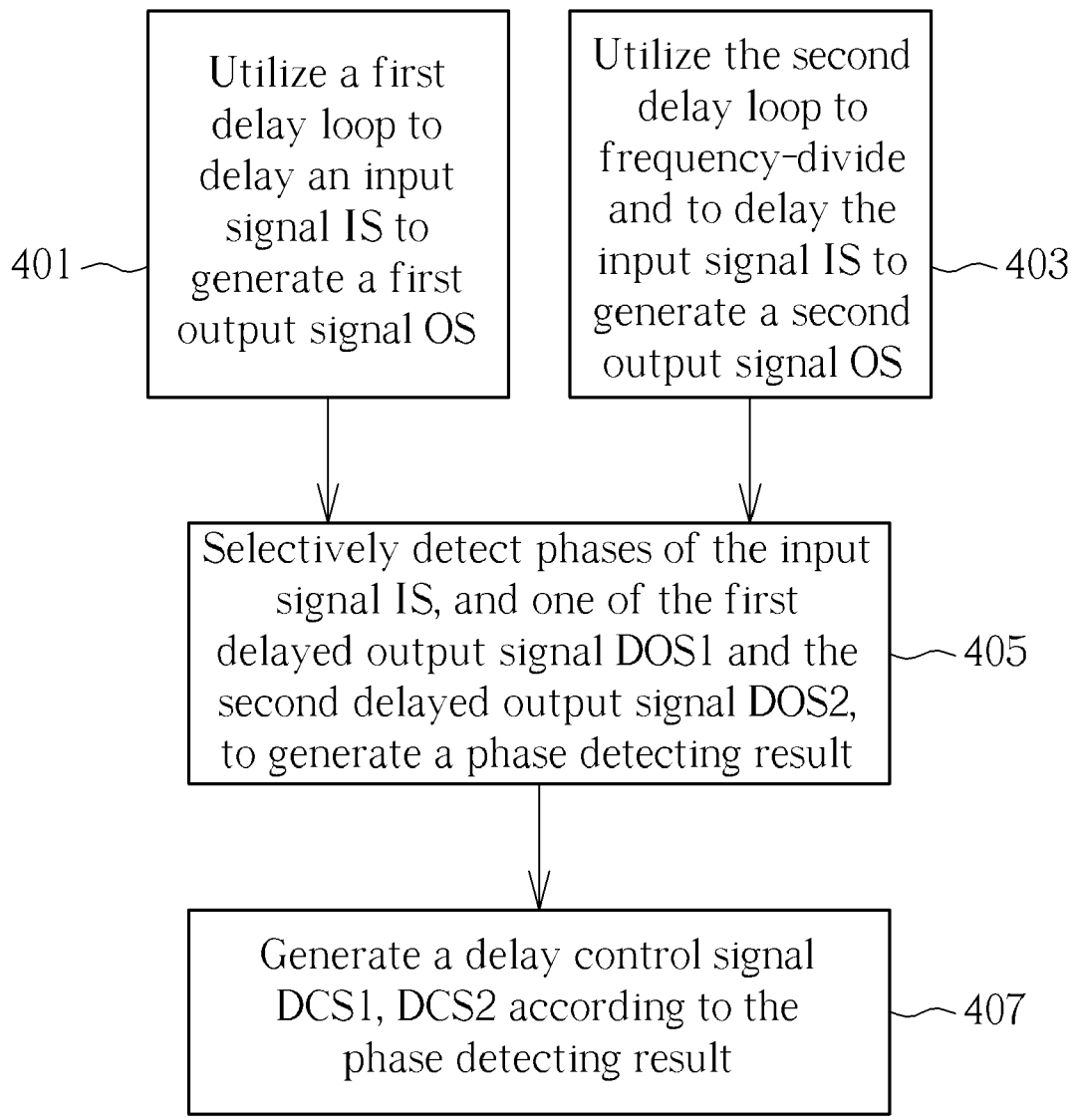
FIG. 4 is a flow chart illustrating a delay lock loop according to one embodiment of the present application.

FIG. 4 is a flow chart illustrating a delay lock loop according to one embodiment of the present application. FIG. 4 discloses the following steps:

Step 401

Utilize a first delay loop 203 to delay an input signal IS to generate a first output signal $OS_1$.

Step 403

Utilize the second delay loop 205 to frequency-divide and to delay the input signal IS to generate a second output signal $OS_2$. A frequency of the first output signal $OS_1$ is higher than which of the second output signal $OS_2$. As above-mentioned, the first output signal $OS_1$ can be generated via delaying the first output signal $OS_1$. Alternatively, the second output signal $OS_2$ can be generated via frequency-dividing and delaying the input signal IS.

Please note that steps 401 and 403 are not necessarily performed at the same time. They can be selectively performed based on the trade between minima forward path/power concern, and the control logic simplicity.

Step 405

Selectively detect phases of the input signal IS, and one of the first delayed output signal $DOS_1$ and the second delayed output signal $DOS_2$, to generate a phase detecting result. The first delayed output signal $DOS_1$ and the second delayed output signal $DOS_2$ are respectively generated according to the first output signal $OS_1$ and the second output signal $OS_2$.

Step 407

Generate a delay control signal $DCS_1$, $DCS_2$ according to the phase detecting result. $DCS_1$ and $DCS_2$ can be same or different. The delay control signal $DCS_1$, $DCS_2$ is transmitted to the first delay loop 203 and the second delay loop 205, to control delay amounts of the first delay loop 203 and the second delay loop 205.

Other detail steps can be acquired depending above-mentioned embodiments, thus are omitted for brevity here.

As above mentioned, the step 401 can do the fast initialization for a quick initialization, than the 403 can do the updates. The delay control signal is a combination of the processes above. Also, another variation is the step 401 finish the complete locking procedure; then 403 maintains DLL updates due to condition changes. Also, the method can only perform the step 403 to finish the complete locking process to maintain the DLL updates all the time.

In view of above-mentioned embodiments, two delay paths operating at different frequencies are applied to a single delay lock loop. The delay loop operating at higher frequency can be utilized for initialization and normal clock output, such that forward path delay can be minimized. Besides, power consumption can be decreased since the delay loop operating at lower frequency is utilized after initialization.

Those skilled in the art will readily observe that numerous modifications and alterations of the device and method may be made while retaining the teachings of the invention.

What is claimed is:

1. A delay lock loop, comprising:
   a first delay loop, for delaying an input signal to generate a first output signal;
   a second delay loop, for frequency-dividing and delaying the input signal to generate a second output signal, wherein a frequency of the first output signal is higher than which of the second output signal;
   a phase detector, for receiving the input signal, a first delayed output signal and a second delayed output signal, to selectively detect phases of the input signal, and one of the first delayed output signal and the second delayed output signal, to generate a phase detecting result, wherein the first delayed output signal and the second delayed output signal are respectively generated according to the first output signal and the second output signal; and
   a delay control circuit, for generating a first delay control signal and a second delay control signal according to the phase detecting result, wherein the first and the second delay control signals are respectively transmitted to the first delay loop and the second delay loop, to control delay amounts of the first delay loop and the second delay loop.

2. The delay lock loop of claim 1, wherein the first delay loop includes a frequency divider to frequency-divide the input signal, and thereby generates the first output signal.

3. The delay lock loop of claim 1, further comprising:
   a delay module, for delaying the first output signal to generate the first delayed output signal and for delaying the second output signal to generate the second delayed output signal; and
   a duty cycle control circuit, for receiving the first output signal, and for adjusting duty cycle of the input signal according to the first output signal.

4. The delay lock loop of claim 1, further comprising:
   a delay module, for delaying the first output signal to generate the first delayed output signal and for delaying the second output signal to generate the second delayed output signal; and
   a duty cycle control circuit, for receiving the first delayed output signal and the second delayed output signal, and for adjusting duty cycle of the input signal according to first delayed output signal and the second delayed output signal.

5. The delay lock loop of claim 1, wherein the first delay loop is turned on while initializing the delay lock loop, where the first delay loop is turned off and the second delay loop is turned on after initializing the delay lock loop.

6. The delay lock loop of claim 1, wherein the first delay loop is turned on for completing locking procedure, where the first delay loop is turned off and the second delay loop is turned on after the locking procedure is completed.

7. The delay lock loop of claim 1, wherein the second delay loop includes a frequency divider for frequency-dividing, where a frequency-dividing ratio of the frequency divider is a predefined value or dynamic generated by a control logic.

8. The delay lock loop of claim 1, wherein the first control signal and the second control signal are identical.

9. A delay lock method, applied to a delay lock loop including a first delay loop and a second delay loop, comprising:
   utilizing the first delay loop to delay an input signal to generate a first output signal;
   utilizing the second delay loop to frequency-divide and to delay the input signal to generate a second output signal, wherein a frequency of the first output signal is higher than which of the second output signal;
   selectively detecting phases of the input signal, and one of the first delayed output signal and the second delayed output signal, to generate a phase detecting result, wherein the first delayed output signal and the second delayed output signal are respectively generated according to the first output signal and the second output signal; and
   generating a first and a second delay control signal according to the phase detecting result, wherein the first and the second delay control signal are respectively transmitted to the first delay loop and the second delay loop, to control delay amounts of the first delay loop and the second delay loop.

10. The delay lock method of claim 9, wherein the first delay loop includes a frequency divider, and the delay lock method further comprises frequency-dividing the input signal, and thereby generates the first output signal.

11. The delay lock method of claim 9, further comprising:
delaying the first output signal to generate the first delayed output signal and for delaying the second output signal to generate the second delayed output signal; and
receiving the first output signal, and for adjusting duty cycle of the input signal according to the first output signal.

12. The delay lock method of claim 9, further comprising:
delaying the first output signal to generate the first delayed output signal and for delaying the second output signal to generate the second delayed output signal; and
adjusting duty cycle of the input signal according to first delayed output signal and the second delayed output signal.

13. The delay lock method of claim 9, further comprising:
turning on the first delay loop while initializing the delay lock loop;
turning off the first delay loop and turning on the second delay loop after initializing the delay lock loop.

14. The delay lock method of claim 9, further comprising turning on the first delay loop to complete locking procedure, and turning off the first delay loop and turning on the second delay loop after the locking procedure is completed.

15. The delay lock method of claim 9, wherein the second delay loop includes a frequency divider for frequency-dividing, where a frequency-dividing ratio of the frequency divider is a predefined value or dynamic generated by control logic.

16. The delay lock method of claim 9, wherein the first control signal and the second control signal are identical.

* * * * *